United States Patent [19]

Okamoto

[11] Patent Number: 5,283,200
[45] Date of Patent: Feb. 1, 1994

[54] METHOD OF FABRICATING COMPLEMENTRAY SEMICONDUCTOR DEVICE

[75] Inventor: Yutaka Okamoto, Tokyo, Japan

[73] Assignee: Sony Corporation, Tokyo, Japan

[21] Appl. No.: 918,683

[22] Filed: Jul. 27, 1992

[30] Foreign Application Priority Data

Jul. 30, 1991 [JP] Japan .................. 3-212728

[51] Int. Cl.⁵ .......................... H01L 21/265
[52] U.S. Cl. ...................... 437/29; 437/34; 437/45; 437/57
[58] Field of Search ............ 437/29, 34, 45, 56, 437/57

[56] References Cited

U.S. PATENT DOCUMENTS

| | | | |
|---|---|---|---|
| 4,525,378 | 6/1985 | Schwabe et al. | 437/45 |
| 4,525,920 | 7/1985 | Jacobs et al. | 437/34 |
| 4,728,619 | 3/1988 | Pfiester et al. | 437/29 |
| 4,761,384 | 8/1988 | Neppl et al. | 437/34 |
| 4,889,825 | 12/1989 | Parrillo | 437/56 |
| 4,929,565 | 5/1990 | Parrillo | 437/56 |
| 5,024,961 | 6/1991 | Lee et al. | 437/34 |
| 5,091,324 | 2/1992 | Hsu et al. | 437/34 |
| 5,141,882 | 8/1992 | Komori et al. | 437/45 |
| 5,164,801 | 11/1992 | Hieda et al. | 257/344 |

FOREIGN PATENT DOCUMENTS

| | | | |
|---|---|---|---|
| 0263468 | 12/1985 | Japan | 432/29 |
| 0093264 | 4/1991 | Japan | 437/56 |
| 4-005832 | 11/1992 | Japan | 437/29 |

Primary Examiner—Olik Chaudhuri
Assistant Examiner—Long Pham
Attorney, Agent, or Firm—Hill, Steadman & Simpson

[57] ABSTRACT

According to this invention, an impurity for forming a P-well region and an impurity for forming an N-channel stopper are sequentially doped in an N-channel region, and an impurity for forming an N-well region and an impurity for forming a P-channel stopper are sequentially doped in a P-channel region. After these impurities are diffused by annealing, an impurity for adjusting a threshold voltage is doped in the entire surface of the resultant structure. As described above, since the doping of these impurities can be performed by steps using a total of two masks, the steps in fabricating a complementary semiconductor device are simple. In addition, since the impurities for forming the well regions and the channel stoppers are diffused by annealing, a large margin against punch through in an element isolation region can be obtained. Furthermore, since the impurity for adjusting a threshold voltage is doped after annealing is performed, diffusion of this impurity is suppressed, thereby minimizing gate swing and the like.

4 Claims, 1 Drawing Sheet

METHOD OF FABRICATING COMPLEMENTRAY SEMICONDUCTOR DEVICE

BACKGROUND OF THE INVENTION

1. Field of the Invention

The present invention relates to a method of fabricating a complementary semiconductor device having a region of a first conductivity type and a region of a second conductivity type.

2. Description of the Prior Art

When a CMOS-LSI which is a complementary semiconductor device is to be fabricated, after an element isolation insulating film is formed, an impurity for forming a well region and an impurity for forming a channel stopper in the well region are ion-implanted through the element isolation insulating film, and an impurity for adjusting a threshold voltage is sequentially ion-implanted. This method has been reported (for example, IEDM88, pp. 100–103 (1988)).

According to this method, when an energy for ion implantation is properly selected, since ion implantation in an N-channel region and ion implantation in a P-channel region can be performed by steps using a total of two masks, the steps in fabricating a semiconductor device are simplified.

In order to obtain a sufficient threshold voltage of a parasitic MOS transistor even though an element isolation insulating film varies in thickness and to increase a margin against punch through in an element isolation region, the profiles of an impurity for forming a well region and an impurity for forming a channel stopper must be extended in the direction of depth of a semiconductor substrate to some extent. For this reason, annealing must be performed at 950° C. in an $N_2$ atmosphere for about 60 minutes.

In order to minimize gate swing and suppress a short channel effect of especially, a P-channel transistor, the profile of an impurity for adjusting a threshold voltage must be decreased in the direction of depth of the semiconductor substrate to effectively increase only an impurity concentration of the surface region of the semiconductor substrate. For this purpose, the above annealing at 950° C. in the $N_2$ atmosphere for about 60 minutes is excessive.

Therefore, in the prior art as described above, both the demands of increasing the margin against punch through in the element isolation region and of minimizing the gate swing cannot be simultaneously satisfied, and these demands must be traded off.

SUMMARY OF THE INVENTION

A method of fabricating a complementary semiconductor device according to the present invention comprises the steps of doping an impurity for forming a region of a first conductivity type and an impurity for forming a channel stopper in the region of the first conductivity type in a region in which the region of the first conductivity type is to be formed, doping an impurity for forming a region of a second conductivity type and an impurity for forming a channel stopper in the region of the second conductivity type in a region in which the region of the second conductivity type is to be formed, performing annealing for diffusing the doped impurities, and doping an impurity for adjusting a threshold voltage in entire surfaces of the region of the first conductivity type and the region of the second conductivity type after the annealing is performed.

As described above, in the method of fabricating a complementary semiconductor device according to the present invention, the impurities for forming the regions of the respective conductivity types and the impurities for forming the channel stoppers in the regions of the respective conductivity types are simultaneously doped, and the impurity for adjusting a threshold voltage is doped in the entire surfaces of the regions of the respective conductivity types. For this reason, these impurities can be doped by steps using a total of two masks.

In addition, since the impurities for forming the regions of the respective conductivity types and the impurities for forming the channel stoppers are diffused by annealing, a margin against punch through in the element isolation region can be increased.

Since the impurity for adjusting a threshold voltage is doped after the annealing is performed, diffusion of the impurity can be suppressed.

Therefore, in the method of fabricating a complementary semiconductor device according to the present invention, the impurities for forming the regions of the respective conductivity types, the impurities for forming the channel stoppers, and the impurity for adjusting a threshold voltage can be implanted by steps using a total of two masks, the steps in fabricating the complementary semiconductor device can be simplified. In addition, although the margin against punch through in the element isolation region can be increased, since the impurity for adjusting a threshold voltage is suppressed, the gate swing can be minimized, and the short channel effect of, especially, the P-channel transistor can be suppressed.

DETAILED DESCRIPTION OF THE PREFERRED EMBODIMENT

Figure 1A:
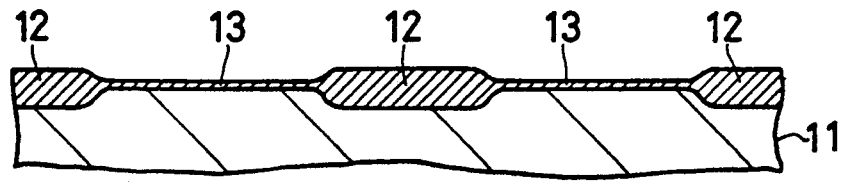
FIGS. 1A to 1E are side sectional views showing the steps in fabricating a complementary semiconductor device according to an embodiment of the present invention.

According to this embodiment, as shown in FIG. 1A, a LOCOS oxide film 12 is formed on the surface of the element isolation region of a semiconductor substrate 11, and a sacrifice oxide film 13 is formed on the surface of the element active region of the semiconductor substrate 11 after a pad oxide film (not shown) is removed. The sacrifice oxide film 13 is used to prevent the semiconductor substrate 11 from damage by later ion implantation or to prevent the semiconductor substrate 11 from contamination in removing a photoresist.

Figure 1B:
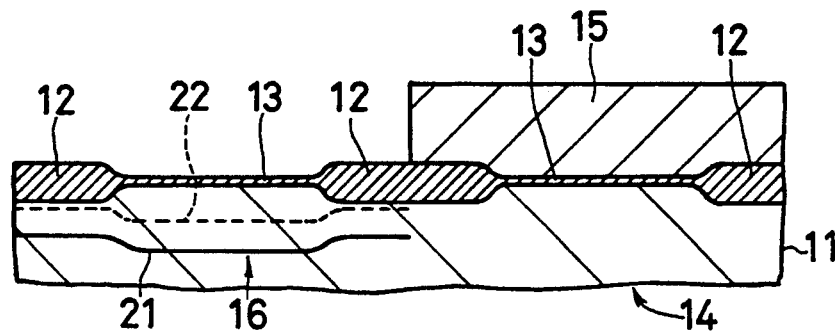

As shown in FIG. 1B, only a P-channel region 14 is covered with a photoresist 15, and an impurity 21 for forming a P-well region and an impurity 22 for forming an N-channel stopper are sequentially ion-implanted in the semiconductor substrate 11 in an N-channel region 16.

Figure 1C:
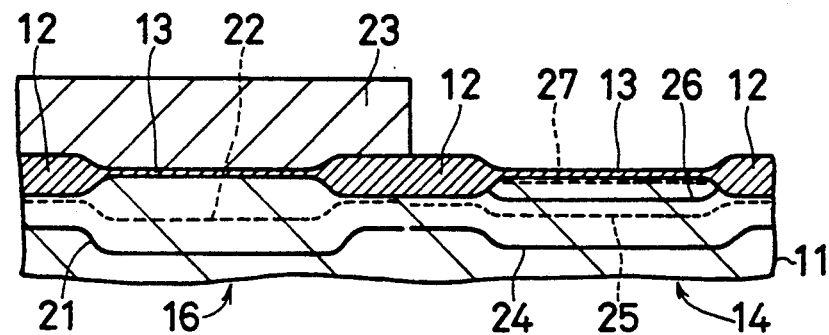

As shown in FIG. 1C, the photoresist 15 is removed, and only the N-channel region 16 is covered with a photoresist 23. An impurity 24 for forming an N-well region, an impurity 25 for forming a P-channel stopper, an impurity 26 for suppressing a short channel effect of a P-channel MOS transistor, and an impurity 27 for adjusting the threshold voltage of the P-channel MOS transistor are sequentially ion-implanted in the semiconductor substrate 11 in the P-channel region 14.

The ion implantation of the impurity 26 is called deep ion implantation. This implantation is performed because a short channel effect easier occurs in the P-channel MOS transistor than in an N-channel MOS transistor. Therefore, the ion implantation of the impurity 26 is not necessarily performed.

In ion implantation performed for adjusting a threshold voltage in the step (to be described later) shown in FIG. 1E, for example, since the threshold voltages of the N-channel MOS transistor and the P-channel MOS transistor are set to be 0.8 V and −0.8 V, respectively, a dosage is short in the P-channel MOS transistor. For this reason, the ion implantation of the impurity 27 is performed to compensate for the short dosage. Therefore, when the dosage is short in the N-channel MOS transistor, this ion implantation is performed in the N-channel region 16. When the dosage is not short, this ion implantation is not required.

Figure 1D:
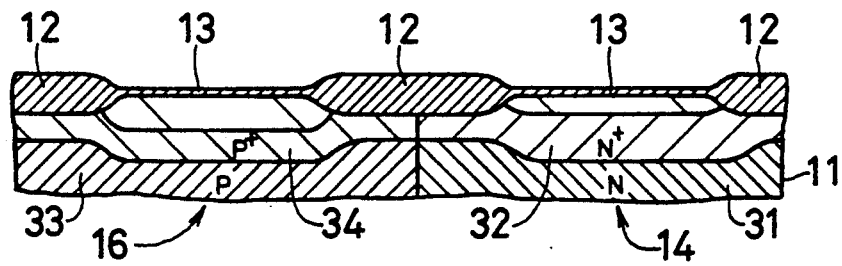

After the photoresist 23 is removed, the resultant structure is annealed, e.g., in an $N_2$ atmosphere at 950° C. for about 60 minutes, to extend the profiles of the impurities 21, 22, 24, and 25 in the direction of depth of the semiconductor substrate 11 as shown in FIG. 1D. As a result, an N-well region 31 and a P-channel stopper 32 are formed in a P-channel region 14, and a P-well region 33 and an N-channel stopper 34 are formed in the N-channel region 16.

Figure 1E:
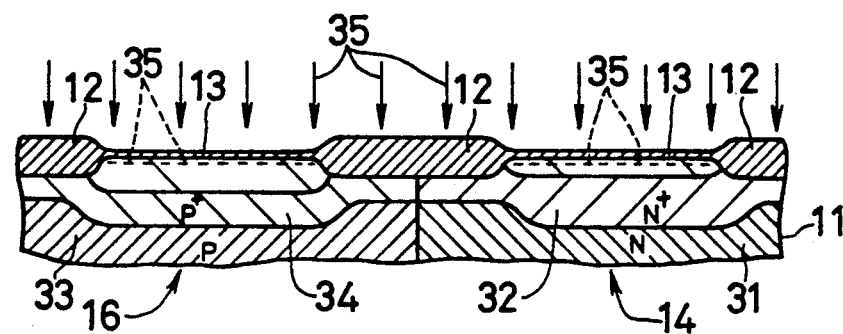

As shown in FIG. 1E, for example, boron 35 for adjusting a threshold voltage is ion-implanted in the entire surface of the semiconductor substrate 11. Special annealing is not necessarily performed for the ion-implanted boron 35. Thereafter, the sacrifice oxide film 13 is removed, a gate oxide film (not shown) is formed in place of the sacrifice oxide film 13, and a P-channel MOS transistor, an N-channel MOS transistor, and the like are formed.

In this embodiment as described above, the impurities 27 and 35 are used to adjust the threshold voltages of a P-channel transistor and an N-channel transistor. However, since only the impurity 27 is ion-implanted at a dosage having a difference between dosages of the P-channel transistor and the N-channel transistor, a large part of the dosage is the impurity 35. Since this impurity 35 is ion-implanted after the annealing in FIG. 1D is performed, extension of the profile of the impurity 35 is suppressed.

What is claimed is:

1. A method of fabricating a complementary semiconductor device having a region of a first conductivity type and a region of a second conductivity type, comprising the steps of:
   doping an impurity for forming said region of the first conductivity type and an impurity for forming a channel stopper in said region of the first conductivity type in a region in which said region of the first conductivity type is to be formed;
   doping an impurity for forming said region of the second conductivity type and an impurity for forming a channel stopper in said region of the second conductivity type in a region in which said region of the second conductivity type is to be formed;
   performing annealing for diffusing said doped impurities; and
   doping an impurity for adjusting a threshold voltage in entire surfaces of said region of the first conductivity type and said region of the second conductivity type after the annealing is performed.

2. A method according to claim 1, further comprising the step of doping an impurity for suppressing a short channel effect in said region in which said region of the second conductivity type is to be formed before the annealing is performed.

3. A method according to claim 1, further comprising the step of doping an impurity for adjusting a threshold voltage in advance in said region in which said region of the second conductivity type is to be formed before the annealing is performed.

4. A method according to claim 1, wherein the impurity which is doped in the entire surfaces of said region of the first conductivity type and said region of the second conductivity type to adjust a threshold voltage after the annealing is performed is boron.

* * * * *